United States Patent
Renz et al.

(10) Patent No.: US 7,518,367 B2
(45) Date of Patent: Apr. 14, 2009

(54) WHOLE-BODY ANTENNA WITH MICROWAVE ELEMENTS, AND MAGNETIC RESONANCE SYSTEM EMBODYING SAME

(75) Inventors: Wolfgang Renz, Erlangem (DE); Markus Yester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/943,768

(22) Filed: Nov. 21, 2007

(65) Prior Publication Data

US 2008/0157769 A1   Jul. 3, 2008

(30) Foreign Application Priority Data

Nov. 22, 2006   (DE) ........................ 10 2006 055 386

(51) Int. Cl.
*G01V 3/00* (2006.01)
(52) U.S. Cl. ..................................................... 324/318
(58) Field of Classification Search ......... 324/300–322; 600/410–435; 333/219–235; 343/824, 904–908
See application file for complete search history.

(56) References Cited

U.S. PATENT DOCUMENTS

| | | | | |
|---|---|---|---|---|
| 4,719,425 A | | 1/1988 | Ettinger | |
| 4,782,297 A | * | 11/1988 | Schmalbein et al. | ........ 324/316 |
| 4,812,763 A | * | 3/1989 | Schmalbein | ................ 324/316 |
| 5,598,097 A | * | 1/1997 | Scholes et al. | .............. 324/316 |
| 6,462,546 B1 | * | 10/2002 | Schmalbein et al. | ........ 324/316 |
| 2003/0227289 A1 | | 12/2003 | Heid et al. | |

* cited by examiner

*Primary Examiner*—Dixomara Vargas
(74) *Attorney, Agent, or Firm*—Schiff Hardin LLP

(57) ABSTRACT

A whole-body antenna for a magnetic resonance system has an antenna structure including at least one antenna rod extending in a longitudinal direction. The antenna rod can be charged with a transmission current to cause an excitation signal to be emitted that causes magnetic resonance signals to be excited in an examination subject arranged in an examination region. Microwave elements for emission of microwave signals into the examination region and/or for acquisition of microwave signals from the examination region are integrated into the first antenna rod on the side thereof facing toward the examination region. The microwave elements include antenna elements and circuit components associated with the antenna elements. The antenna elements are arranged on the side of the antenna rods facing toward the examination region. The circuit components are surrounded by the antenna rods both on the side thereof facing toward the examination region and on the side thereof facing away from the examination region.

18 Claims, 4 Drawing Sheets

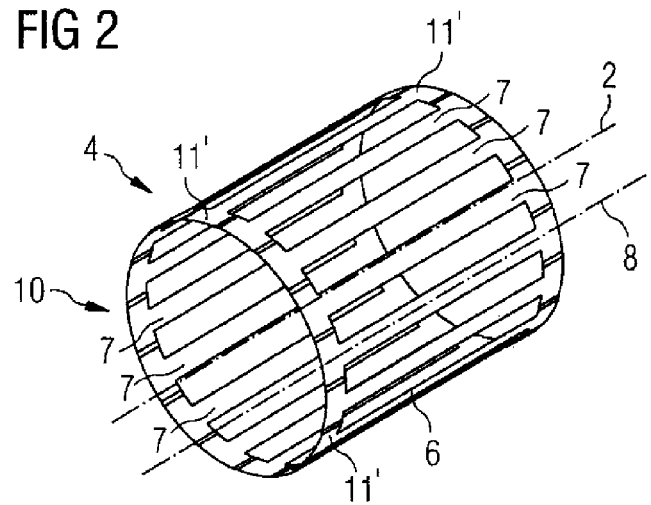
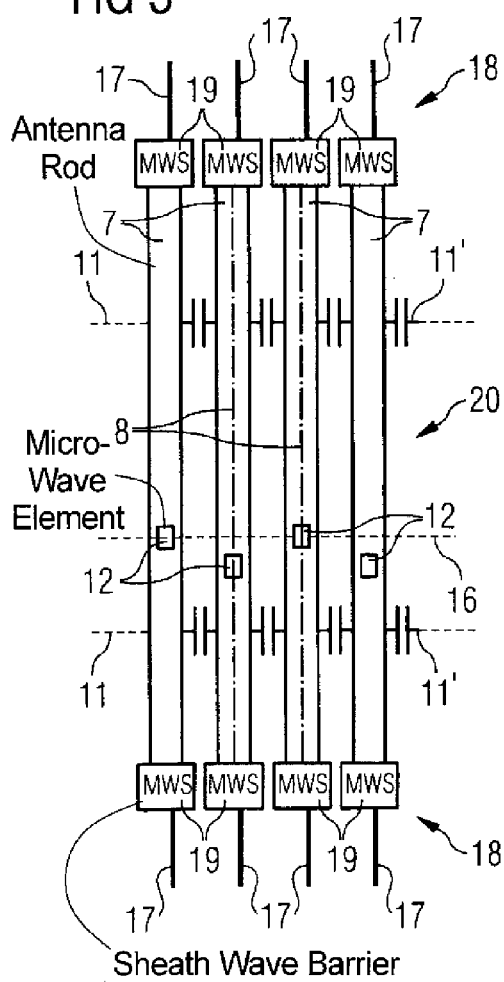
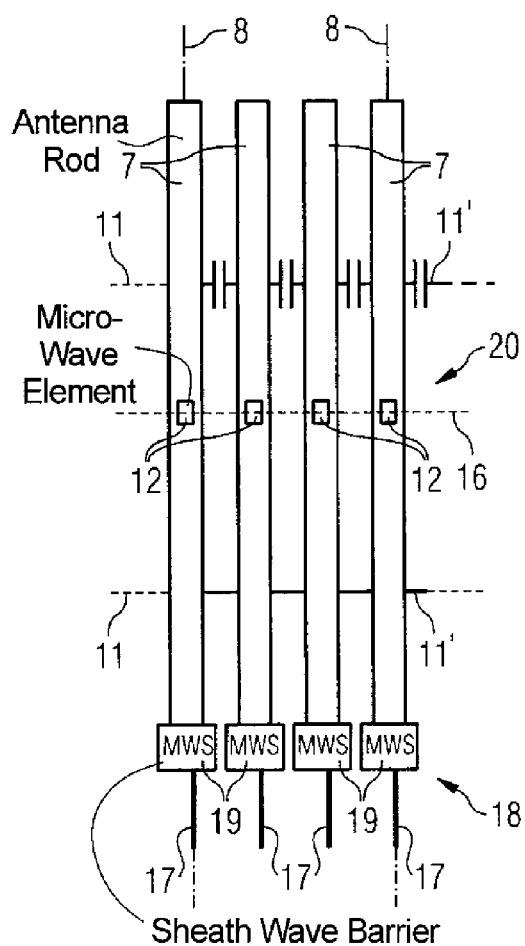

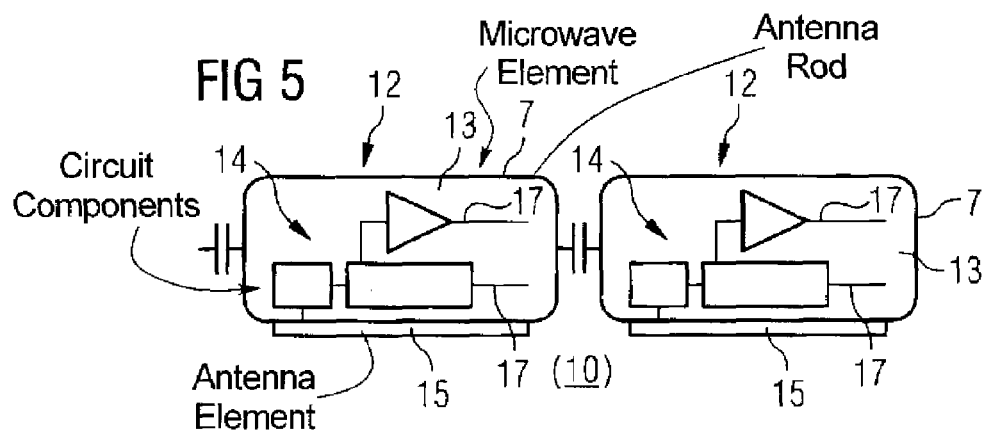
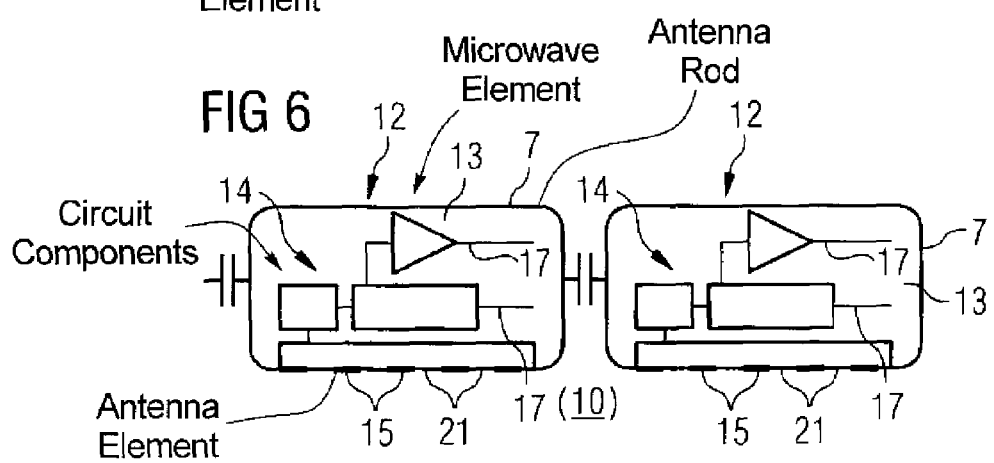
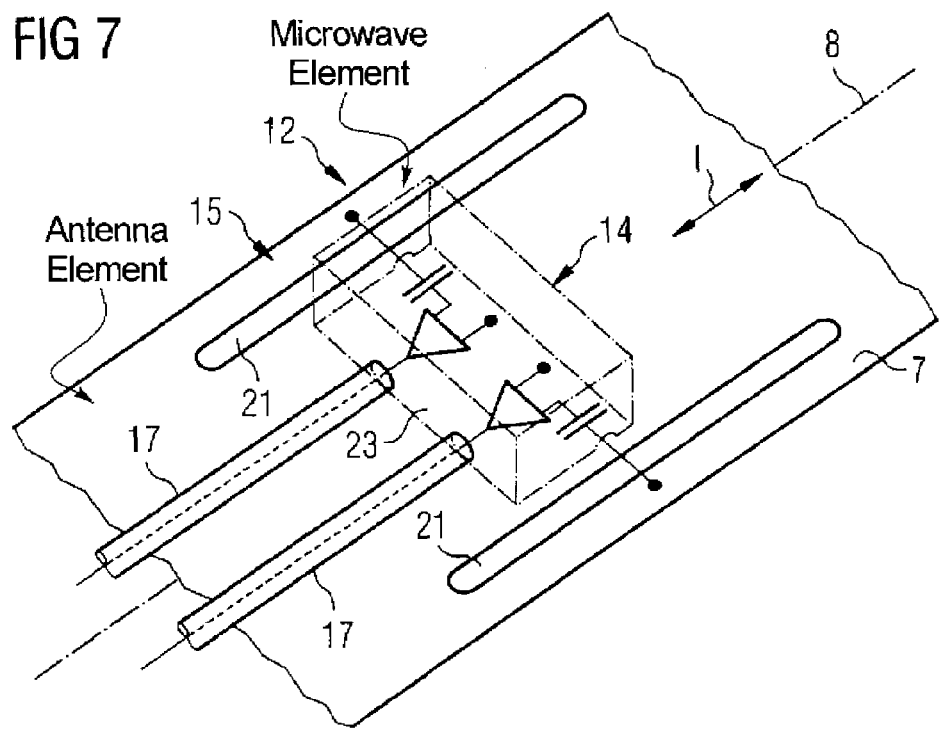

WHOLE-BODY ANTENNA WITH MICROWAVE ELEMENTS, AND MAGNETIC RESONANCE SYSTEM EMBODYING SAME

BACKGROUND OF THE INVENTION

1. Field of the Invention

The present invention concerns a whole-body antenna for a magnetic resonance system, of the type having an antenna structure including at least one first antenna rod extending in a longitudinal direction, the antenna rod being charged with a first transmission current that causes a first excitation signal to be emitted that excites magnetic resonance signals in an examination subject arranged in an examination region; and wherein microwave elements for emission of microwave signals into the examination region and/or for acquisition of microwave signals from the examination region are integrated into the antenna rod on the side thereof facing toward the examination region.

The present invention furthermore concerns a magnetic resonance system with a basic magnet, a gradient magnet system, a whole-body antenna of the type described above and a control device for controlling the gradient magnet system and the whole-body antenna.

2. Description of the Prior Art and Related Subject Matter

Whole-body antennas of the type described above and magnetic resonance systems of the type described above are generally known.

A number of local coils are used in magnetic resonance systems since local coils exhibit a significantly better signal-to-noise ratio for signal acquisition purposes than a whole-body antenna. The local coils must be connected with the control device in order to use the magnetic resonances acquired by the local coils. In the simplest case, this occurs via coaxial cable.

It is known to convert magnetic resonance signals acquired by the local coils to a microwave frequency and to wirelessly transfer the microwaves to reception antennas. An example of such a magnetic resonance system is disclosed in DE 102 19 749 A1 corresponding to United States Patent Application Publication No. 2003/0227289, but there is no disclosure regarding the arrangement of the reception antennas for acquisition of the microwave signals.

A magnetic resonance system that has a number of microwave reception antennas is described in DE 10 2005 022 551 A1, wherein the microwave reception antennas are arranged so as to surround an examination region. The microwave reception antennas are arranged radially (relative to a central axis of the magnetic resonance system) within a whole-body antenna.

DE 10 2005 022 551 A1 had not yet been published as of the priority filing date of the present invention. It is therefore not prior art.

U.S. Pat. No. 4,719,425 A discloses a whole-body antenna for a magnetic resonance system that has an antenna structure which for its part comprises a plurality of antenna rods extending in a longitudinal direction. The antenna rods can be charged with transmission currents by means of which excitation signals can be emitted so that an examination subject arranged in an examination region can be excited to emit magnetic resonance signals. The antenna rods can furthermore be charged with microwave signals which can be emitted by the antenna rods into the examination region. The antenna rods can embody a slit system for use for radiation of microwaves into the examination subject.

SUMMARY OF THE INVENTION

An object of the present invention is to arrange a whole-body antenna and microwave elements in a magnetic resonance system in an optimally efficient and space-saving manner.

According to the invention, the microwave elements are formed by antenna elements and circuit components associated with the antenna elements. The antenna elements are arranged on the side of the antenna rods facing toward the examination region. The electrical components are surrounded by the antenna rods both on their side facing toward the examination region and on the side facing away from the examination region.

If the aforementioned antenna rod is designated as a first antenna rod, the inventive antenna structure has at least one second antenna rod extending in the longitudinal direction that can be charged with a second transmission current by means of which an excitation signal can be emitted that causes magnetic resonance signals to be excited in the examination subject arranged in the examination region. In this case, second microwave elements for emission of microwave signals into the examination region and/or for acquisition of microwave signals from the examination region are integrated into the second antenna rod on the side thereof facing toward the examination region.

In many cases the antenna structure additionally has at least two further antenna rods extending in the longitudinal direction, with all antenna rods proceeding substantially parallel to a central axis and being distributed around the central axis such that the examination region corresponds to the inside of the antenna structure. Each of the further antenna rods can be charged with respective further transmission currents that cause an excitation signal to be emitted that excites magnetic resonance signals in the examination subject arranged in the examination region. This embodiment is in particular suitable when the antenna structure is fashioned as a saddle coil, a birdcage resonator or similar antenna structure.

Further microwave elements for emission of microwave signals in the examination region and/or for acquisition of microwave signals from the examination region are integrated into the further antenna rods on their respective sides facing toward the examination region.

Generally the antenna rods interact with one another (viewed in the circumferential direction of the central axis) in two termination planes spaced from and orthogonal to the central axis (viewed in the direction of the central axis). In contrast to the typical conventional structures, at least some of the antenna rods can extend axially beyond at least one of the termination planes, as viewed in the direction of the central axis. In this case the microwave elements are advantageously arranged in the antenna rods between the termination planes.

The antenna rods can be hollow. The advantages of such an embodiment are described in the following.

Conductors to the wiring electronics can run inside the antenna rods when they are hollow. The conductors are advantageously fashioned as shielded conductors. They protrude from the antenna rods in the longitudinal direction of the antenna rods. The conductors are provided with sheath wave barriers near the ends of the antenna rods.

Alternatively, the conductors to the electronic (circuit) components can run outside of the antenna rods. In this case the conductors are fashioned as shielded coaxial cables.

The electronics components can be filters that block signals whose frequency in the range of the frequency of the excitation signals. Unwanted injections (coupling) thus can be suppressed or at least reduced.

The antenna elements can be independent elements, but are advantageously components of the antenna rods.

The antenna elements advantageously have slits extending in the longitudinal direction of the respective antenna rod, the length of which slits being approximately half of the wavelength of the microwaves. In this embodiment, the electronic components are advantageously connected with the antenna rods on both sides of the slits, as seen transverse to the longitudinal direction of the antenna rods.

BRIEF DESCRIPTION OF THE DRAWINGS

FIG. 2 shows a whole-body antenna.

FIGS. 3 and 4 respectively show sections of the whole-body antenna from FIG. 2 in unrolled representation.

FIGS. 5 and 6 respectively show cross-sections through two antenna rods of the whole-body antenna of FIG. 2

FIG. 7 shows a section of an antenna rod.

DESCRIPTION OF THE PREFERRED EMBODIMENTS

Figure 1:
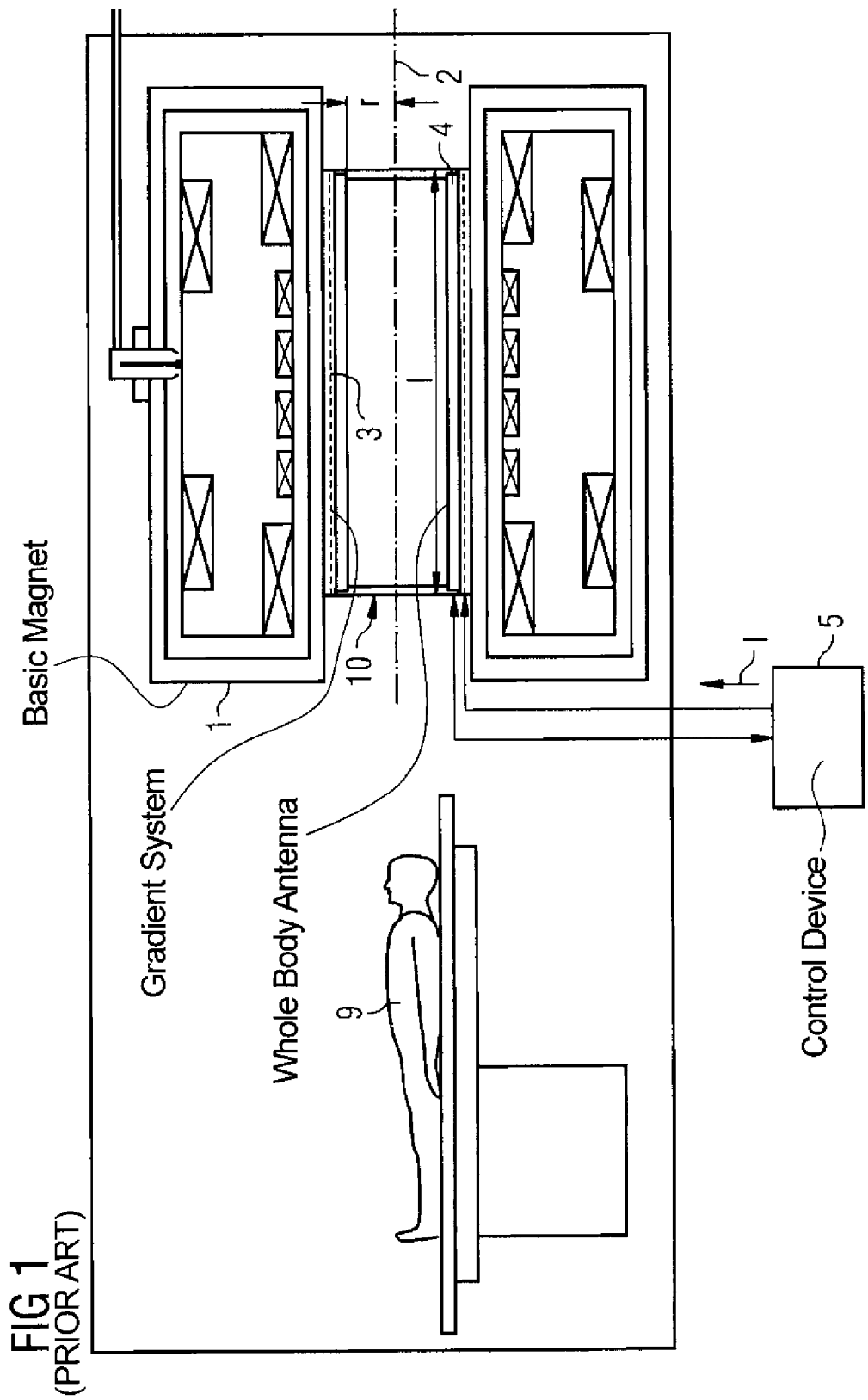
FIG. 1 schematically illustrates a first type of a known magnetic resonance system, in which the invention can be used.

The magnetic resonance system shown in FIG. 1 has a basic magnet 1. The basic magnet 1 is essentially fashioned as a cylinder such that it turns around a central axis 2.

The terms "axial", "radial" and "tangential" used in the following are always referenced to an axis, for example to the central axis 2. The terms "radial" and "tangential" mean directions in a plane orthogonal to the respective axis. The term "radial" means a direction in this plane that is directed toward the respective axis or away from it. The term "tangential" designates a direction around the axis in the plane orthogonal to the axis. When the terms "axial", "radial" and "tangential" are used without explicit reference to an axis, they concern the central axis 2. If they should refer to another axis, it is indicated which axis they concern.

A gradient magnet system 3 is arranged radially within the basic magnet 1. A whole-body antenna 4 is arranged radially within the gradient magnet system 3. Like the gradient magnet system 3 and the basic magnet 1, the whole-body antenna 4 extends tangentially around the central axis 2.

The magnetic resonance system has a control device 5. The gradient magnet system 3 and the whole-body antenna 4 are controlled by the control device 5.

The whole-body antenna 4 is normally fashioned as a birdcage resonator (see FIG. 2). Particularly in the case of the design as a birdcage resonator (but also for other designs, for example, as a saddle coil) the whole-body antenna 4 has an antenna structure 6 that extends around the central axis 2 at a radial distance r. The antenna structure 6 has a number of antenna rods 7. The number of antenna rods 7 is minimally 4, and is normally 16 or 32. Other numbers of antenna rods 7 are also possible, for example 6, 8, 12, 24 or 40 antenna rods 7. The antenna rods 7 extend in the direction of rod axes 8, and thus extend in the longitudinal direction.

In the normal case the antenna rods 7 run parallel to the central axis 2, but alternative embodiments are possible in which the rod axes 8 define a direction that is only substantially parallel to the central axis 2. In this last cited case the respective rod axis 8 proceeds in a direction that exhibits a first sub-component and a second sub-component. The two sub-components complement one another relative to the direction of the respective rod axis 8. The first sub-component is (exactly) parallel to the central axis 2. The second sub-component is orthogonal to the central axis 2. As long as the first sub-component is greater than the second sub-component, the direction of the rod axis 8 is essentially parallel to the central axis 2. For example, a course of the rod axes 9 substantially parallel to the central axis 2 can produce an antenna structure 6 is designed slightly conical and/or wherein the antenna rods 7 turn around the central axis 2 in a slightly helical shape, similar to the lands and grooves of the barrel of a firearm. A combination of these two measures is also possible.

The whole-body antenna 4 is normally operable both as a transmission antenna and as a reception antenna. At least the transmission mode is always possible. In the transmission mode the antenna rods 7 are charged with radio-frequency transmission currents I by corresponding amplifiers. Due to this charging with transmission currents I, the antenna rods 7 emit excitation signals by means of which an examination subject 9 can be excited to emit magnetic resonance signals. For this purpose, the examination subject 9 must be arranged in the inside 10 of the antenna structure 6. The inside of the antenna structure 6 thus corresponds to an examination region 10.

The antenna rods 7 interact in two termination planes 11 as viewed in the circumferential direction of the central axis 2 (thus tangentially). The termination planes 11 are spaced from one another as viewed in the direction of the central axis 2 (thus axially) and are orthogonal to the central axis 2. In the embodiment of the whole-body antenna 4 as a birdcage resonator, for example, ferrules 11' that couple the antenna rods 7 with one another galvanically and/or capacitively (corresponding to FIGS. 3 and 4) are arranged in the termination planes 11.

According to FIGS. 5 through 7, which are subsequently explained in detail, microwave elements 12 are integrated into the antenna rods 7 on their sides facing toward the examination region 10. The microwave elements 12 serve to emit microwave signals into the interior 10 of the antenna structure 6. Alternatively or additionally, it is possible for microwave signals from the inside 10 of the antenna structure 6 to be acquired by means of the microwave elements 12. Like the gradient magnet system 3 and the whole-body antenna 4, the microwave elements 12 are controlled by the control device 5. This applies both for the transmission mode and the acquisition mode of the microwave elements 12. In the acquisition mode the microwave signals acquired by the microwave elements 12 can also be received by the control device 5.

The excitation signals and the magnetic resonance signals exhibit a magnetic resonance frequency that normally lies between 8 and 200 MHz. For example, the magnetic resonance frequency (Larmor frequency) for hydrogen lies at approximately 127 MHz given a 3 Tesla magnetic resonance system. By contrast, the microwave frequency is significantly higher, being at least 1 GHz, normally even at 3 GHz or higher, for example at 5 to 12 GHz.

In the embodiment of FIGS. 5 and 6, the antenna rods 7 are hollow. Circuit components 14 are arranged in the inside 13 of the antenna rods 7. Antenna elements 15 are arranged on the side of the antenna rods 7 facing toward the examination region 10, thus on the side arranged radially inwardly. The circuit components 14 are associated with the antenna elements 15. Together the circuit components 14 and the antenna elements 15 form each of the microwave elements 12.

Due to the arrangement of the circuit components 14 in the inside 13 of the hollow antenna rods 7, the circuit components 14 are surrounded on all sides by the antenna rods in a plane 16 orthogonal to the central axis 2. in principle, however, it is sufficient for the circuit components 14 to be surrounded by the antenna rods 7 radially on the inside and radially on the outside (thus radially on both sides, namely on the side facing toward the examination region 10 and on the side facing away from the examination region 10). In this case it is only necessary for the gap that remains to be small enough (as viewed in the tangential direction).

The circuit components 14 are connected with the control device 6 via conductors 17. In the embodiments of FIGS. 5 and 6 (see also FIGS. 3 and 4) the conductors 17 proceed inside the antenna rods 7. They are advantageously fashioned as shielded conductors, in particular as coaxial cables.

The conductors 17 exit from the antenna rods 7 at the ends 18 of the antenna rods (see FIGS. 3 and 4). They therefore protrude from the antenna rods 7 in the direction of the central axis 2. To suppress sheath waves, the conductors 17 are provided with sheath wave barriers 19 near the ends 18 of the antenna rods 7.

According to FIGS. 3 and 4, the antenna rods 7 can extend beyond the termination planes 11 axially on one side or axially on both sides. When this is the case, the microwave elements 12 are advantageously arranged in a core region 20 of the antenna rods 20. The core region 20 is defined as being between the termination planes 11.

The antenna elements 15 of the microwave elements 12 can be fashioned as patch antennas (see FIG. 5). In this case the antenna elements 15 extend over a substantial portion of the width of the antenna rods 7 as viewed in the tangential direction, but this is not essential.

Alternatively, the antenna elements 15 of the microwave elements 12 (see FIGS. 6 and 7) can be fashioned as slit antennas. In this case (see in particular FIG. 7) the antenna elements 15 has slits 21. The slits 21 hereby advantageously extend in the direction of the respective rod axis 8.

The length of the slits 21 (as viewed in the direction of the respective rod axis 8) is approximately half of the wavelength of the microwaves. The wavelength results from the known relation $$\lambda = c/f$$

wherein $\lambda$ is the sought wavelength, c is the speed of light and f is the frequency of the microwaves. For example, given a microwave frequency f of 3 GHz, the wavelength $\lambda$ is thus approximately 10 cm.

According to FIGS. 6 and 7, the circuit components 14 are connected with the antenna rods 7 on both sides of the slits, as viewed tangentially to the central axis 2 or transversely to the longitudinal direction of the antenna rods 7. This embodiment is particularly useful when the antenna elements 15 of the microwave elements 12 are components of the antenna rods 7.

According to FIGS. 5 and 6 the circuit components 14 include filter elements 22 (this can also be the case in the embodiment according to FIG. 7). Signals of a frequency in the range of the frequency of the excitation signals can be blocked by the filter elements 22. For example, the filter elements 22 can be suitably designed as highpass filters, bandpass filters or band rejection filters.

Although the arrangement of the conductors 17 with the circuit components 14 in the antenna rods 7 is possible and preferred, it is not mandatory. For example, according to FIG. 7 the conductors 17 are arranged outside of the antenna rods 7, and in fact on the radially-inward side of the antenna rods 7. In this case they are fashioned as shielded coaxial cables. In FIG. 7 as well, the circuit components 14 are also not arranged in the antenna rods 7. For example, according to FIG. 7 shield housings 23 are present that are located radially inward on the antenna rods 7. In this case the circuit components 14 are arranged inside the shield housings 23.

In the preceding the invention was described in the context of an MR system of the type known as a horizontal field system, in which the stationary basic magnetic field extends in the direction of the central axis 2. The present invention can also be applied in MR systems of the type known as vertical field systems.

Figure 8:
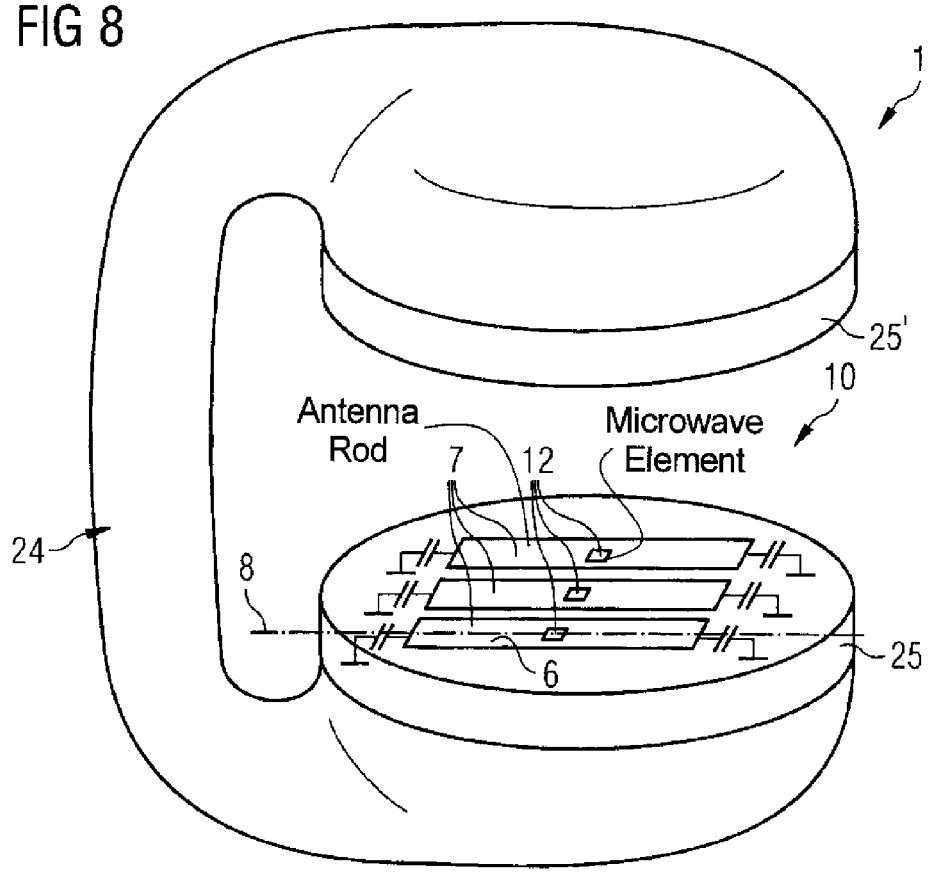
FIG. 8 schematically illustrates a second type of magnetic resonance examination system, embodying the invention.

As shown in FIG. 8, a vertical field system normally has a yoke 24 via which two pole shoes 25, 25' magnetically interact with one another. The examination region 10 is located between the pole shoes 25, 25'. A gradient magnet system is normally arranged on the pole shoes 25, 25', but the gradient magnet system is not shown in FIG. 8 (nor in FIG. 9).

An antenna structure 6 with antenna rods 7 is arranged on the pole shoes 25, 25' (in FIG. 8 this is visible only for the lower pole shoe 25). The embodiment of the individual antenna rods 7 corresponds to the embodiments described above in connection with FIGS. 5 through 7.

Figure 9:
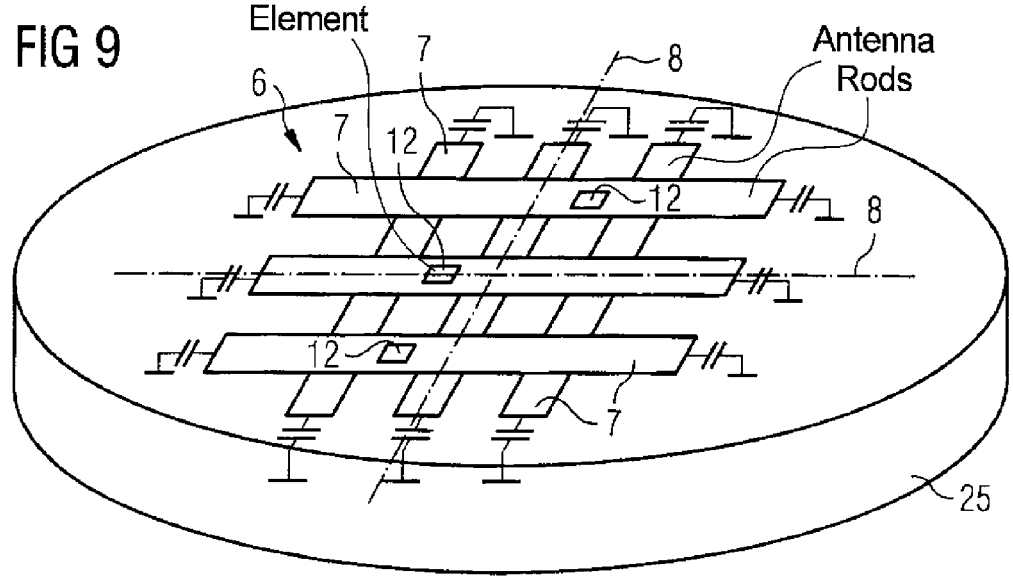
FIG. 9 shows a pole shoe with an inventive antenna structure.

As shown in FIG. 9, an antenna structure 6 with orthogonally intersecting antenna rods 7 can alternatively be arranged on the pole shoes 25, 25'. In this case circularly-polarized radio-frequency fields can be generated by means of the antenna structure 6. The remaining embodiments (in particular the embodiment of the antenna rods 7 corresponding to FIGS. 5 through 7) furthermore are applicable.

Although modifications and changes may be suggested by those skilled in the art, it is the intention of the inventors to embody within the patent warranted hereon all changes and modifications as reasonably and properly come within the scope of their contribution to the art.

We claim as our invention:

1. A whole body antenna for a magnetic resonance system comprising:
    an antenna structure comprising at least one antenna rod proceeding in a longitudinal direction, said antenna rod being supplied with a transmission current that causes emission of an excitation signal into an examination subject in an examination region with which said antenna structure interacts, to cause emission of magnetic resonance signals from the examination subject;
    a microwave element integrated into said antenna rod on a side thereof facing said examination region, said microwave element causing at least one of microwave signals to be emitted into the examination region and microwave signals to be received from the examination region; and
    said microwave element comprising at least one antenna element and at least one circuit component associated with the antenna element, said antenna element being located at said side of said antenna rod facing the examination region, and said circuit component being surrounded by the antenna rod both at a side of the circuit components facing the examination region and a side of the circuit component facing away from the examination region.

2. A whole body antenna as claimed in claim 1 wherein said antenna rod is a first antenna rod and said transmission current is a first transmission current, and said microwave element is a first microwave element, and wherein said antenna structure comprises at least one second antenna rod extending in said longitudinal direction, said at least one second antenna rod being supplied with a second transmission current that causes said second antenna rod to emit an excitation signal in the examination region that causes, in combination with said excitation signal emitted by said first antenna rod, said magnetic resonance signal to be emitted by said examination subject, and comprising at least one second microwave element that causes at least one of emission of microwave signals into the examination region and acquisition of microwave signals from the examination region, said second microwave element being integrated into the second antenna rod at a side thereof facing toward the examination region.

3. A whole body antenna as claimed in claim 2 wherein said antenna structure comprises:
   at least two further antenna rods extending in a longitudinal direction, with all of said antenna rods proceeding substantially parallel to a central axis of the antenna structure and being distributed around said central axis and defining an interior of said antenna structure, in which said examination region is located; and
   each of said further antenna rods being respectively supplied with a further transmission current that causes an excitation signal to be emitted by the respective antenna rod into the examination region that, in combination with all other excitation signals emitted by all other antenna rods, causes said magnetic resonance signal to be emitted from said examination subject.

4. A whole body antenna as claimed in claim 3 wherein each of said further antenna rods comprises at least one further microwave element, said further microwave element causing at least one of emission of microwave signals in the examination region and acquisition of microwave signals from the examination region, each further microwave element being respectively integrated in a further antenna rod at a side of that further antenna rod facing toward the examination region.

5. A whole body antenna as claimed in claim 2 wherein said at least one first antenna rod and said at least one second antenna rod interact with each other in two termination planes that are spaced from each other along a central axis of the examination subject, said two termination planes being orthogonal to said central axis and proceeding circumferentially around said central axis.

6. A whole body antenna as claimed in claim 5 wherein at lease one of said antenna rods extends axially beyond at least one of said termination planes, in a direction of the central axis.

7. A whole body antenna as claimed in claim 6 wherein said microwave elements in each of said antenna rods are located between said termination planes.

8. A whole body antenna as claimed in claim 1 wherein said at least one antenna rod is hollow.

9. A whole body antenna as claimed in claim 8 wherein said electronic components are contained inside said hollow antenna rod.

10. A whole body antenna as claimed in claim 9 wherein said at least one first antenna rod is formed as a shielded conductor having a conductor protruding from the antenna rod along the longitudinal direction, and a sheath wave barrier being located at the conductors in a region near an end of the at least one first antenna rod.

11. A whole body antenna as claimed in claim 1 comprising conductors connected to said electronic components, said conductors proceeding outside of said at least one first antenna rod and being formed as a shielded coaxial cable.

12. A whole body antenna as claimed in claim 1 wherein said circuit components comprise at least one filter element that walks signals in a frequency range of the excitation signals.

13. A whole body antenna as claimed in claim 1 wherein said antenna elements are formed as components of said at least one antenna rod.

14. A whole body antenna as claimed in claim 1 wherein said antenna element comprises a slit in said antenna rod proceeding in the longitudinal direction, said slit having a length equal to approximately one-half of a wavelength of the microwaves associated with the microwave elements.

15. A whole body antenna as claimed in claim 14 wherein said circuit components are connected with said antenna rod at both sides of said slit, as viewed transversely to said longitudinal direction.

16. A magnetic resonance system comprising:
   a basic magnet at least partially surrounding an examination region that is configured to receive at least a portion of an examination subject therein;
   a gradient system that emits gradient fields into said examination region;
   a whole body antenna comprising an antenna structure comprising at least one antenna rod proceeding in a longitudinal direction, said antenna rod being supplied with a transmission current that causes emission of an excitation signal into an examination subject in an examination region with which said antenna structure interacts, to cause emission of magnetic resonance signals from the examination subject, and at least one microwave element integrated into said antenna rod on a side thereof facing said examination region, said microwave element causing at least one of microwave signals to be emitted into the examination region and microwave signals to be received from the examination region, and said microwave element comprising at least one antenna element and at least one circuit component associated with the antenna element, said antenna element being located at said side of said antenna rod facing the examination region, and said circuit component being surrounded by the antenna rod both at a side of the circuit components facing the examination region and a side of the circuit component facing away from the examination region; and
   a control unit that operates said basic magnet, said gradient system and said whole body antenna, including controlling said microwave element to emit or acquire said microwave signals.

17. A magnetic resonance system as claimed in claim 16 wherein said basic magnet is a horizontal field magnet.

18. A magnetic resonance system as claimed in claim 16 wherein said basic magnet is a vertical field magnet.

* * * * *